(12) United States Patent
Kuring

(10) Patent No.: US 10,469,069 B2
(45) Date of Patent: Nov. 5, 2019

(54) POWER SEMICONDUCTOR CIRCUIT

(71) Applicant: VALEO SIEMENS EAUTOMOTIVE GERMANY GMBH, Erlangen (DE)

(72) Inventor: Carsten Kuring, Berlin (DE)

(73) Assignee: VALEO SIEMENS EAUTOMOTIVE GERMANY GMBH, Erlangen (DE)

( * ) Notice: Subject to any disclaimer, the term of this patent is extended or adjusted under 35 U.S.C. 154(b) by 0 days.

(21) Appl. No.: 16/309,638

(22) PCT Filed: Jun. 14, 2017

(86) PCT No.: PCT/EP2017/064554
§ 371 (c)(1),
(2) Date: Dec. 13, 2018

(87) PCT Pub. No.: WO2017/216228
PCT Pub. Date: Dec. 21, 2017

(65) Prior Publication Data
US 2019/0165778 A1 May 30, 2019

(30) Foreign Application Priority Data

Jun. 16, 2016 (DE) .......................... 10 2016 210 798

(51) Int. Cl.
*H03K 17/082* (2006.01)
*G05F 3/24* (2006.01)
*H03K 5/24* (2006.01)

(52) U.S. Cl.
CPC ......... *H03K 17/0826* (2013.01); *G05F 3/245* (2013.01); *H03K 5/24* (2013.01); *H03K 17/082* (2013.01); *H03K 17/0828* (2013.01)

(58) Field of Classification Search
CPC ...... H03K 17/0826; H03K 5/24; G05F 3/245; H02M 1/32
See application file for complete search history.

(56) References Cited

U.S. PATENT DOCUMENTS

| | | | |
|---|---|---|---|
| 4,553,084 A * | 11/1985 | Wrathall | G01R 17/06 323/314 |
| 7,505,240 B2 * | 3/2009 | Asada | H03K 5/08 327/539 |
| 7,932,754 B1 | 4/2011 | Broach et al. | |
| 2002/0079944 A1 | 6/2002 | Sander | |
| 2008/0007238 A1 | 1/2008 | Ohtake | |

(Continued)

FOREIGN PATENT DOCUMENTS

| | | |
|---|---|---|
| EP | 2858245 A1 | 4/2015 |
| GB | 2532215 A | 5/2016 |

OTHER PUBLICATIONS

PCT/ISA/210, "International Search Report for International Application No. PCT/EP2017/064554", dated Aug. 21, 2017.

*Primary Examiner* — Kyle J Moody
(74) *Attorney, Agent, or Firm* — Manabu Kanesaka

(57) ABSTRACT

A power semiconductor circuit includes a power semiconductor device for switching a load, and a comparator which is directly or indirectly connected to the power semiconductor device at a connection point for the load by means of a first input and to which a predefined or predefinable reference voltage can be fed at a second input, the power semiconductor device being activatable by means of an output of the comparator.

6 Claims, 2 Drawing Sheets

(56) References Cited

U.S. PATENT DOCUMENTS

Figure 1:
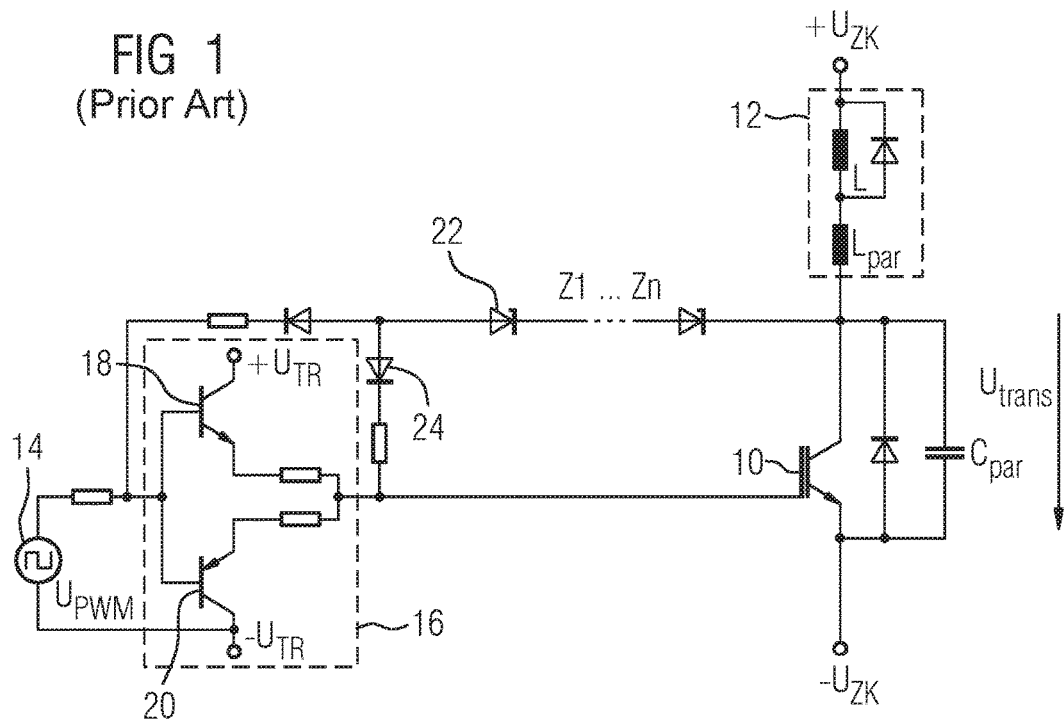

| | | | |
|---|---|---|---|
| 2014/0168041 A1* | 6/2014 | Chen | G09G 3/3696 345/87 |
| 2015/0280416 A1 | 10/2015 | Kreuter et al. | |
| 2015/0280425 A1 | 10/2015 | Kreuter et al. | |
| 2015/0373811 A1 | 12/2015 | Dunser et al. | |
| 2017/0194861 A1* | 7/2017 | Iravani | H02M 3/00 |

* cited by examiner

POWER SEMICONDUCTOR CIRCUIT

RELATED APPLICATIONS

The present application is National Phase of International Application No. PCT/EP2017/064554 filed Jun. 14, 2017, and claims priority from German Patent Application No. 10 2016 210 798.4, filed Jun. 16, 2016, the disclosure of which is hereby incorporated by reference herein in its entirety.

The invention relates to a circuit comprising a power semiconductor device, in particular a circuit comprising a power semiconductor device, referred to as a power semiconductor circuit for short, for activating, in a clocked manner, a connected load by means of a power semiconductor device controlled in a clocked manner, said load comprising at least parasitic and/or discrete inductors.

Inductors comprised by a load that is to be switched, specifically parasitic inductors and/or discrete inductors without a flyback path, inevitably lead at the clocked power semiconductor device during the switch-off process to transient overvoltages with high voltage peaks, since the inductor or the inductors seeks or seek to maintain the flow of current. Such overvoltages can lead to the destruction or accelerated degeneration of the power semiconductor device. In order to avoid overvoltages of this kind, what is known as active clamp wiring of the power semiconductor device is often used.

Here, a Zener diode and a diode are connected between the drain and the gate terminals of the power semiconductor device in question, wherein the breakdown voltage of the Zener diode is lower than the breakdown voltage of the power semiconductor device. In the event of a voltage peak at the drain terminal and a resultant overvoltage at the blocking power semiconductor device junction, the Zener diode is conductive above the breakdown voltage thereof and the gate potential of the power semiconductor device is raised, whereby the power semiconductor device passes into linear operation. The energy stored in the inductor can thus be converted into heat in the partially conductive power semiconductor device junction and thus can be safely dissipated.

A disadvantage, however, of this known circuit for protecting the power semiconductor device is that the principle of active clamping can be applied successfully only if it is possible to reliably and reproducibly identify whether the transient overvoltage exceeds a threshold value referred to hereinafter as the clamping voltage. An exact setting of the active clamping circuit is very difficult, however, owing to comparatively high tolerances, caused by manufacture, temperature and/or age, especially of the Zener diode comprised by the active clamping circuit or the plurality of Zener diodes comprised by the active clamping circuit.

The object of the invention, on this basis, is to describe an alternative power semiconductor circuit which comprises a circuit part for protecting the power semiconductor device against transient overvoltages. The object specifically lies in describing a power semiconductor circuit comprising a circuit part for protecting the power semiconductor device against transient overvoltages which can be set easily and in an uncomplicated manner to a desired clamping voltage.

This object is achieved in accordance with the invention by means of a power semiconductor circuit having the features of claim 1. Here, in the case of a power semiconductor circuit comprising a power semiconductor device for switching a load which comprises discrete and/or parasitic inductors, wherein, when the load is disconnected by means of the power semiconductor device, transient overvoltages result at the power semiconductor device, the following is provided: The power semiconductor circuit comprises a circuit part for protecting the power semiconductor device against transient overvoltages. This circuit part comprises a comparator. This is directly or indirectly connected to the connection point of the load to the power semiconductor device by means of a first input. A predefined or predefinable reference voltage can be fed to the comparator at a second input and is fed to the comparator during operation of the power semiconductor circuit. The power semiconductor device is activatable by means of an output of the comparator, and the power semiconductor device is activated during operation of the power semiconductor circuit depending on the state of the output. Here, the output of the comparator is given on the basis of a comparison of the potentials applied at the two inputs.

The advantage of the invention lies in the fact that the clamping voltage from which the circuit part for protecting the power semiconductor device is effective is predefined by means of the reference voltage. This avoids the previous situation in which the clamping voltage had to be predefined in a complex manner by means of individual electronic components and suitable selection thereof in accordance with particular characteristic variables (in the case of a Zener diode in accordance with the breakdown voltage thereof). The voltage applied at the connection point of the load, specifically the connection point of the load to the power semiconductor device, is compared with the reference voltage by means of the comparator. In the case of a transient overvoltage resulting when the load is switched off, this transient overvoltage is also applied at this connection point, for example the drain terminal of the power semiconductor device. The transient overvoltage is thus compared directly or indirectly with the reference voltage. A direct or indirect comparison of the two voltages by means of the comparator is dependent on whether said comparator is directly or indirectly connected to the connection point of the load to the power semiconductor device. In a specific embodiment of the innovation proposed here, the comparator is connected to the connection point of the load to the power semiconductor device via at least one resistor of a voltage divider, that is to say not directly, but indirectly.

Advantageous embodiments of the invention are the subject of the dependent claims. Dependency references used in the claims indicate a further development of the subject matter of the main claim by the features of the dependent claim in question. They should not be understood to discount the attainment of independent objective protection for the combination of features of the dependent claims referred to. Furthermore, with regard to the interpretation of the claims, in the event that a feature is specified in greater detail in a subordinate claim, it is to be assumed that a limitation of this kind is not provided in any of the preceding claims. Lastly, it should be noted that the circuit described here can also be developed in accordance with the dependent method claims, and vice versa, for example in that the circuit has means for carrying out individual method steps.

In one embodiment of the power semiconductor circuit a voltage divider, in particular an ohmic resistor of a voltage divider formed with two ohmic resistors, is arranged upstream of the comparator. The transient overvoltage occurring at the connection point of the load to the power semiconductor device is divided proportionally in accordance with the respective resistance values by means of the voltage divider. The reference voltage fed to the comparator for comparison can therefore be reduced in accordance with the resistance ratio of the voltage divider. In addition, the part of the voltage divider arranged upstream of the power semiconductor device functions as a current-limiting resistor.

In a further embodiment of the power semiconductor device the reference voltage can be adjusted by means of a reference voltage circuit. An operating voltage is applied to said circuit during operation. The reference voltage circuit comprises, in parallel branches, in each case a series circuit with an electronic switch element and a reference resistor. All switch elements comprised by the reference voltage circuit can be controlled individually. Each series circuit represents a path that can be connected within the reference voltage circuit. The voltage that drops in the event of activation of a switch element and the resultant activation of a particular path via the resistor in question is summed with the voltages that drop over other activated paths to give the reference voltage delivered by the reference voltage circuit. With appropriate selection of the resistance values, for example different resistance values in all paths, in the case of n connectable paths there are up to $2^n$ different reference voltage levels which can be generated by means of the reference voltage circuit. During operation of a power semiconductor circuit which comprises a reference voltage circuit of this kind or which is connected to a reference voltage circuit of this kind, a desired reference voltage is set by selective activation of individual switch elements of the reference voltage circuit, and said reference voltage is fed to the comparator during operation of the power semiconductor circuit.

In a method for operating a power semiconductor circuit of the kind described here and hereinafter, a clamping voltage is set by means of a predefined reference voltage in accordance with the particular operating situation of the power semiconductor device. By setting the reference voltage in accordance with an operating situation of the power semiconductor device, it can be taken into consideration for example that the breakdown voltage of the power semiconductor device and therefore also the admissible level of the transient overvoltage increases with the temperature of the power semiconductor device (chip temperature). Accordingly, the reference voltage can thus be adapted, in particular increased, in a temperature-dependent manner.

An exemplary embodiment of the invention will be explained in greater detail hereinafter with reference to the drawing. Items or elements corresponding to one another are provided in all figures with the same reference signs.

The exemplary embodiment shall not be understood to limit the invention. Rather, additions and modifications are also quite possible within the scope of the present disclosure, in particular those that are deducible to a person skilled in the art with a view to achieving the object by a combination or variation of individual features or method steps described in conjunction with the general or more detailed part of the description and contained in the claims and/or the drawing and that lead, by combinable features, to a novel subject matter or to novel method steps or method step sequences.

IN THE DRAWING

Figure 2:
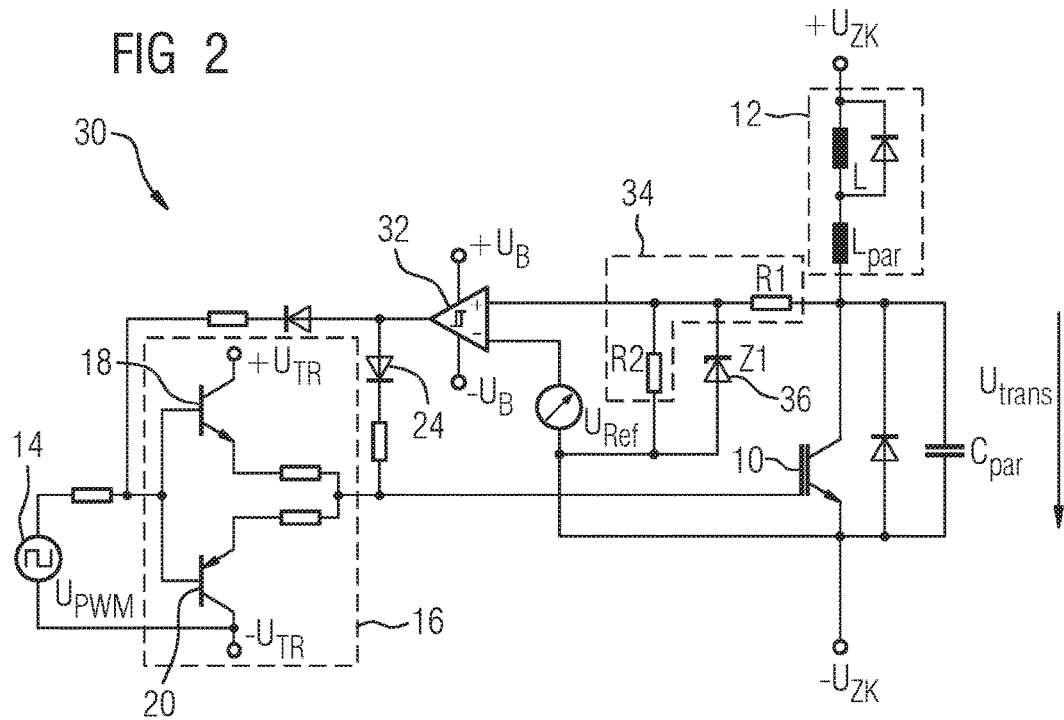
Figure 3:
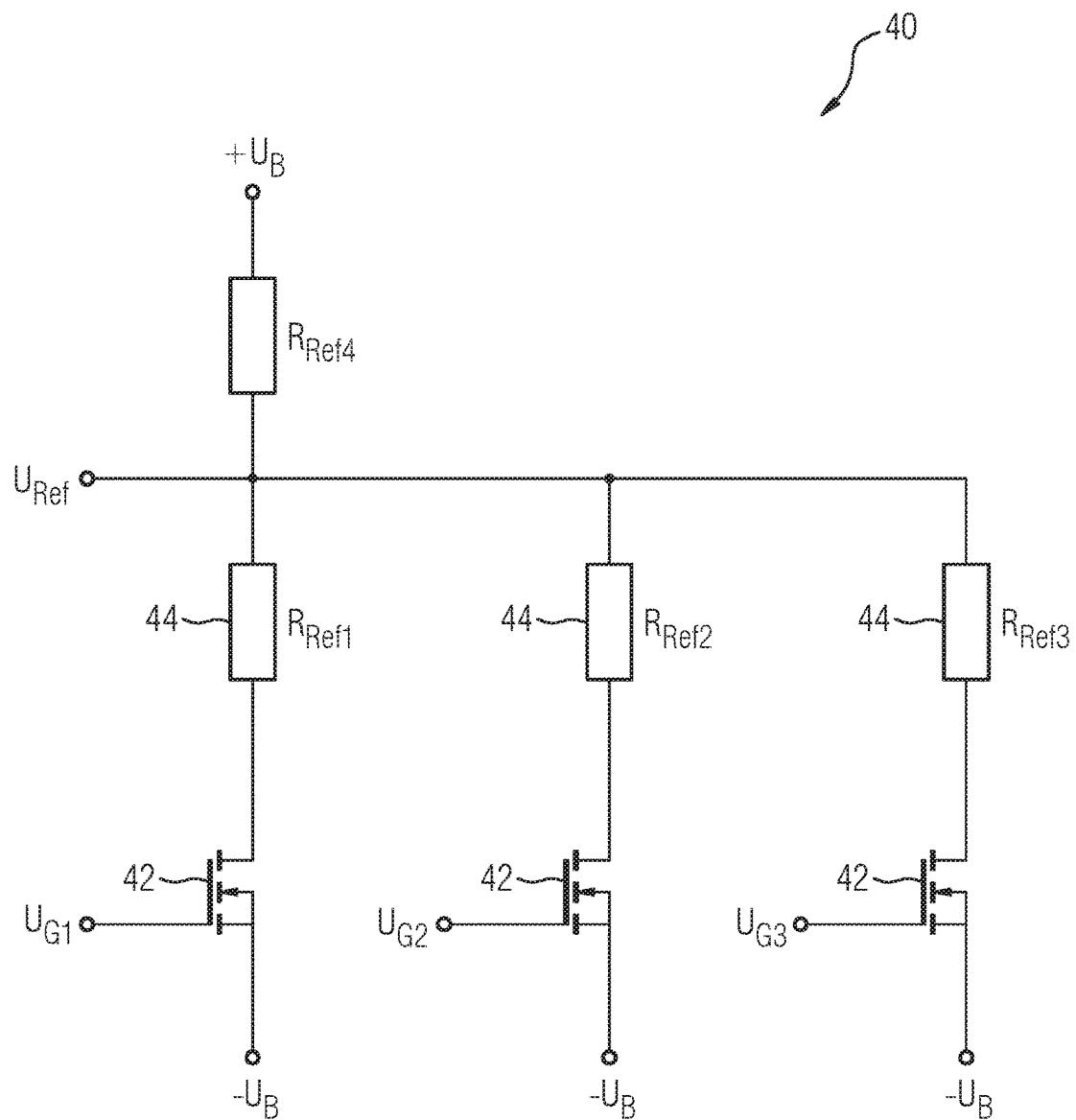

FIG. 1 shows a power semiconductor circuit with a known active clamping circuit, FIG. 2 shows a power semiconductor circuit with a power semiconductor device and a circuit part for protecting the power semiconductor against transient overvoltages, and FIG. 3 shows a reference voltage circuit usable together with a power semiconductor circuit according to FIG. 2.

Modern power semiconductor devices, in particular power MOSFETs, are used especially in switching applications, for example in DC/DC converters, in what is known as PWM operation.

FIG. 1 shows a circuit with a power semiconductor device 10, wherein the power semiconductor device 10 is designed to switch a connected load 12 which comprises parasitic inductors ($L_{par}$) and discrete inductors (L). In PWM operation the power semiconductor device 10 is controlled by means of a signal source 14, which outputs a pulse-width modulated signal (PWM signal; $U_{PWM}$). On account of the control by means of a signal source 14 of this kind, the power semiconductor device 10 is operated selectively in the fully switched-on and fully switched-off state.

The further description—without foregoing further generality—shall be continued on the basis of a signal source 14 which outputs a pulse-width modulated signal ($U_{PWM}$) functioning as control signal. The signal source 14 is generally a device which outputs a clocked control signal. This shall be considered always to be the case hereinafter.

The pulse-width modulated signal—or generally a control signal generated by the signal source 14—is fed to a driver circuit 16. This comprises two complementary semiconductor switches, specifically a first driver switch 18 that is conductive during the positive pulse of the control signal and a second driver switch 20 that is conductive during the negative pulse of the control signal, and in each case a current-limiting resistor arranged downstream or upstream in the current flow direction respectively. The first driver switch 18 and the second driver switch 20 are connected to the gate terminal of the power semiconductor device 10 via said resistors. The first driver switch 18 for example is embodied as a npn transistor and the second driver switch 20 as a pnp transistor.

During the positive pulse of the control signal, the potential of a positive driver voltage $+U_{TR}$ applied at the first driver switch 18 is applied at the gate terminal of the power semiconductor device 10. The positive driver voltage $+U_{TR}$ is set such that the power semiconductor device 10 is connected through an account of the positive driver voltage $+U_{TR}$. The drain-source path of the power semiconductor device 10 is thus conductive during the positive pulse of the control signal, and the connected load 12 is activated.

During the negative pulse of the control signal, the first driver switch 18 blocks, whereas the second driver switch 20 is conductive, such that a negative driver voltage $-U_{TR}$ applied at the second driver switch 20 is applied at the gate terminal of the power semiconductor 10. The negative driver voltage is negative compared to the positive driver voltage $+U_{TR}$ and is set such that the power semiconductor device 10 blocks on account of the negative driver voltage $-U_{TR}$. The drain-source path of the power semiconductor device 10 is consequently non-conductive during the negative pulse of the control signal, and the load 12 is deactivated accordingly. On account of the parasitic and/or discrete inductors of the load 12, these initially drive on further the current interrupted by means of the power semiconductor device 10, at least temporarily, and this results in a voltage peak at the drain terminal of the power semiconductor device 10 and in an overvoltage over the drain-source path of the power semiconductor device 10.

This overvoltage is applied only very briefly, specifically only as long as the inductors of the load 12 drive the interrupted current on account of the electrical energy stored there. The duration of the overvoltage situation is usually less than a millisecond (>1 ms). The overvoltage is referred to accordingly hereinafter as a transient overvoltage $U_{trans}$.

The transient overvoltage $U_{trans}$ nevertheless can lead to the destruction or accelerated degeneration of the power semiconductor device, in spite of the short duration. Thus, it is sought to avoid transient overvoltages $U_{trans}$ of this kind. In the prior art, what is known as an active clamping circuit is known in this regard, and the circuit shown in FIG. 1 comprises an active clamping circuit of this kind, in which a Zener diode 22 and a diode 24 are connected between the drain terminal of the power semiconductor device 10 and the gate terminal of the power semiconductor device 10. In the shown embodiment the active clamping circuit comprises a Zener diode path having a plurality of Zener diodes 22 connected in series.

In the case of a transient overvoltage $U_{trans}$ above the breakdown voltage of the Zener diode or each Zener diode 22, this Zener diode or the Zener diode path is conductive. This leads, over the current path with the diode 24, to an increase of the gate potential. The power semiconductor device 10 is thus at least partially conductive in linear operation, and the energy stored in the inductors of the load 12 can drain via the power semiconductor device 10. At the same time, the driver circuit 16 is controlled over a path electrically parallel to the diode 24, such that the first driver switch 18 connects through, whereas the second driver switch 20 blocks. As the transient overvoltage $U_{trans}$ subsides, the control of the driver circuit 16 ends, such that the first driver switch 18 blocks and the second driver switch 20 connects through. The potential at the gate terminal of the power semiconductor device 10, said potential being increased on account of the transient overvoltage $U_{trans}$, is then dissipated via the second driver switch 20. Lastly, the temporary activation of the power semiconductor 10 in linear operation thus ends and the circuit with the load 12 is interrupted and the load 12 is deactivated. Some of the energy stored in the inductors of the load 12 is also dissipated over the path of the control of the power semiconductor 10 and the driver circuit 16.

Problems encountered in a power semiconductor circuit of this kind in the active clamping circuit comprised thereby are in particular the comparatively high tolerances, caused by manufacture, temperature and/or age, of the Zener diode 22 or the Zener diodes 22 in respect of the various breakdown voltages thereof. The breakdown voltage of an individual Zener diode 22 or—in the case of a Zener diode path—the breakdown voltage of the series connection of the Zener diodes 22 comprised thereby determines the detectable transient overvoltage $U_{trans}$. A transient overvoltage $U_{trans}$ beneath this breakdown voltage is not identified, and the electrical energy associated therewith, accordingly, is not dissipated in the previously described way. It is therefore desirable to define the breakdown voltage particularly precisely. This precise definition is made difficult, however, on account of the above-mentioned tolerances. The design must consequently be based under consideration of the aforesaid tolerances and therefore typically requires large reserves. On account of such reserves, an active clamping circuit of the kind shown in FIG. 1 will potentially be effective without requiring the operating situation of the power semiconductor device 10.

FIG. 2 shows an embodiment of a circuit comprising a power semiconductor device 10 (power semiconductor circuit 30) in accordance with the approach presented here. The power semiconductor circuit 30 comprises—exactly as in FIG. 1—a signal source 14 for emitting a control signal and a driver circuit 16 comprising a first and a second driver switch 18, 20. The power semiconductor device 10 is also used here again for the clocked switching of a load 12 comprising parasitic inductors $L_{par}$ and discrete inductors L. The clocked activation of the power semiconductor device 10 is implemented here as well, exactly as in the prior art according to FIG. 1, by means of a control signal emitted by a signal source 14, in particular by means of a pulse-width modulated control signal.

The special feature lies in the fact that the transient overvoltage $U_{trans}$ occurring when the power semiconductor device 10 is switched off is compared by means of a comparator 32 with a predefined or predefined reference voltage $U_{Ref}$. In the embodiment shown in FIG. 2 the transient overvoltage $U_{trans}$ is divided proportionally by means of a voltage divider 34 (which in essence is optional) comprising two ohmic resistors (R1, R2). One of the resistors (R1) of the voltage divider 34 then advantageously at the same time causes a current limitation, and the part of the transient overvoltage $U_{trans}$ dropping over the other resistor (R2) is compared by means of the comparator 32 with the reference voltage $U_{Ref}$.

The reference voltage $U_{Ref}$ is applied between the source terminal of the power semiconductor device 10 and the inverting input of the comparator 32. The non-inverting input of the comparator 32 is connected indirectly, specifically via part of the voltage divider 34, to the drain input of the power semiconductor device 10, and over this path the comparator 32 detects a possible transient overvoltage $U_{trans}$ and compares it with the reference voltage $U_{Ref}$.

Should the transient overvoltage $U_{trans}$ reach the set value of the reference voltage $U_{Ref}$ or exceed it ($U_{trans} \geq U_{Ref}$), by means of the output of the comparator 32, on the one hand over the current path with the diode 24, the gate potential of the power semiconductor device 10 is raised, such that said power semiconductor device 10 passes into linear operation and is partially conductive, and on the other hand the driver circuit 16 is controlled. As described above in conjunction with FIG. 1, the energy stored in the inductors of the load 12 can drain away via the partially conductive power semiconductor device 10. The simultaneous temporary activation of the driver circuit 16 has the effect likewise already described above in conjunction with FIG. 1, specifically that the increased potential at the gate terminal of the power semiconductor device 10, said potential being increased as a result of the transient overvoltage $U_{trans}$, does not disappear again directly on account of the otherwise connected-through second driver circuit 20 and the negative driver voltage $-U_{TR}$ applied thereto. Thus, an at least temporary linear operation of the power semiconductor device 10 is possible during the period for which the transient overvoltage $U_{trans}$ is present.

The use of a predefined or predefined reference voltage $U_{Ref}$ allows the level of the transient overvoltage $U_{trans}$ that is to be detected to be set in an exact manner. The above-mentioned tolerances are therefore irrelevant for the setting of the switching or response threshold of the active clamping circuit proposed here. A fundamentally optional Zener diode 36 is used to protect the comparator 32.

The illustration in FIG. 3 shows a circuit functioning as a reference voltage circuit 40 for delivering an adjustable reference voltage $U_{Ref}$. During operation, an operating voltage $U_B$ is applied at the reference voltage circuit 40, and the reference voltage $U_{Ref}$ is derived from said operating voltage. The reference voltage circuit 40 is a voltage divider and comprises, on one side of the voltage divider, a resistor network having at least two parallel branches/paths. In each branch/path the reference voltage circuit 40 comprises a series circuit having an electronic switching element 42 and a reference resistor 44. For example, MOSFETs are suitable electronic switching elements 42. Each switching element 42 can be controlled individually, for example by means of a control circuit (not shown here). The control of a switching element 42 causes the path in question to be activated and therefore causes the ohmic resistor of the totality of parallel paths to change, thus resulting in a change to the ratios of the resistance values of the two sides of the voltage divider. The totality of parallel paths forms one side of the voltage divider. The reference voltage $U_{Ref}$ set in the form of the activation of individual or multiple switching elements 42 can be tapped at a centre tap of the voltage divider. The other side of the voltage divider forms a resistor or a resistor network. The operating voltage $U_B$ divides proportionally, in the manner known per se, between the two sides of the voltage divider. The greater is the total resistance of the parallel paths, the closer the reference voltage $U_{Ref}$ that can be tapped at the reference voltage circuit 40 approximates the operating voltage $U_B$, such that an increasingly higher reference voltage $U_{Ref}$ results. The lower is the total resistance of the parallel paths, the lower is the reference voltage $U_{Ref}$ that can be tapped at the reference voltage circuit 40. With a favourable selection of the resistance values of the reference resistors 44 in the individual parallel paths, up to $2^n$ reference voltage levels can be set with a reference voltage circuit 40 of this kind, wherein n stands for the number of parallel paths. In the illustration in FIG. 3, a reference voltage circuit 40 having three parallel paths is shown.

Although the invention has been illustrated and described in greater detail by the exemplary embodiment, the invention is not limited by the disclosed example(s), and other variations can be derived herefrom by a person skilled in the art without departing from the scope of protection of the invention.

Individual important aspects of the description presented here can thus be briefly summarised as follows: What is described is a power semiconductor circuit 30 comprising a power semiconductor device 10 for switching a load 12, and a comparator 32 which is directly or indirectly connected to a connection point of the load 12 to the power semiconductor device 10 by means of a first input and to which a predefined or predefinable reference voltage $U_{Ref}$ can be fed at a second input, the power semiconductor device 10 being activatable by means of an output of the comparator 32.

LIST OF REFERENCE SIGNS 10 power semiconductor device
12 load
14 signal source
16 driver circuit
20 (first) driver switch
22 (second) driver switch
24 Zener diode
24 diode
26, 82 (free)
30 power semiconductor circuit
32 comparator
34 voltage divider
36 Zener diode
38 (free)
40 reference voltage circuit
42 switching element
44 reference resistor

The invention claimed is:

1. A power semiconductor circuit comprising:
a power semiconductor device for switching a load comprising discrete and/or parasitic inductors, wherein when the load is disconnected by means of the power semiconductor device, transient overvoltages result;
a comparator which is directly or indirectly connected to a connection point of the load to the power semiconductor device by means of a first input and to which a predefined or predefinable reference voltage is fed at a second input; and
a reference voltage circuit at which an operating voltage is applied during operation and sets a reference voltage, the reference voltage circuit being formed in parallel branches, each of the parallel branches including a series circuit having an electronic switching element and a reference resistor, wherein the switching elements in the reference voltage circuit are controlled individually,
wherein the power semiconductor device is activated by means of an output of the comparator.

2. The power semiconductor circuit according to claim 1, wherein the reference voltage circuit is a voltage divider arranged upstream of the comparator.

3. The power semiconductor circuit according to claim 1, wherein the reference resistors in the reference voltage circuit are different.

4. A method for operating a power semiconductor circuit according to claim 1, wherein a clamping voltage is set by means of the reference voltage in accordance with a particular operating situation of the power semiconductor device.

5. The method according to claim 4, wherein the clamping voltage level is set in accordance with a particular temperature of the power semiconductor device.

6. The power semiconductor circuit according to claim 1, wherein the reference voltage circuit further includes a resistor at a side opposite to the reference resistors to divide the operating voltage proportionally between two sides of the reference voltage circuit.

* * * * *